United States Patent
Gousev et al.

(10) Patent No.: US 6,642,156 B2
(45) Date of Patent: Nov. 4, 2003

(54) METHOD FOR FORMING HEAVY NITROGEN-DOPED ULTRA THIN OXYNITRIDE GATE DIELECTRICS

(75) Inventors: Evgeni Gousev, Mahopac, NY (US); Atul C. Ajmera, Wappingers Falls, NY (US); Christopher P. D'Emic, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/919,970

(22) Filed: Aug. 1, 2001

(65) Prior Publication Data

US 2003/0027392 A1 Feb. 6, 2003

(51) Int. Cl.$^7$ ............................................. H01L 21/469
(52) U.S. Cl. .................. 438/786; 438/787; 438/788; 438/791
(58) Field of Search .................. 438/786, 787, 438/788, 791, 792, 238, 398, 253, 584–594, 759–785, 793–799, 478–498

(56) References Cited

U.S. PATENT DOCUMENTS

| | | | | |
|---|---|---|---|---|
| 5,258,333 A | * | 11/1993 | Shappir et al. .............. | 437/235 |
| 5,407,870 A | * | 4/1995 | Okada et al. ................ | 437/241 |
| 5,455,204 A | | 10/1995 | Dobuzinsky et al. ........ | 437/238 |
| 5,464,783 A | * | 11/1995 | Kim et al. ..................... | 437/42 |
| 5,578,848 A | | 11/1996 | Kwong et al. .............. | 257/296 |
| 5,683,929 A | * | 11/1997 | Ohi et al. ...................... | 437/60 |
| 5,783,469 A | | 7/1998 | Gardner et al. ............. | 438/199 |
| 5,821,172 A | * | 10/1998 | Gilmer et al. ............... | 438/769 |
| 5,840,610 A | | 11/1998 | Gilmer et al. ............... | 438/301 |
| 5,880,040 A | | 3/1999 | Sun et al. .................... | 438/769 |
| 5,939,131 A | * | 8/1999 | Kim et al. ..................... | 427/81 |
| 5,939,763 A | | 8/1999 | Hao et al. .................... | 257/411 |
| 5,972,800 A | | 10/1999 | Hasegawa ................... | 438/761 |
| 5,972,804 A | * | 10/1999 | Tobin et al. ................. | 438/786 |
| 6,020,243 A | | 2/2000 | Wallace et al. ............. | 438/287 |
| 6,046,487 A | * | 4/2000 | Benedict et al. ............ | 257/510 |
| 6,060,369 A | | 5/2000 | Gardner et al. ............. | 438/407 |
| 6,150,286 A | * | 11/2000 | Sun et al. .................... | 438/791 |
| 6,297,173 B1 | * | 10/2001 | Tobin et al. ................. | 438/778 |
| 6,303,520 B1 | * | 10/2001 | Kwong et al. .............. | 438/769 |
| 6,376,324 B1 | * | 4/2002 | Mandelman et al. ....... | 438/386 |
| 6,380,056 B1 | * | 4/2002 | Shue et al. .................. | 438/591 |
| 2001/0044218 A1 | * | 11/2001 | Moore et al. ............... | 438/763 |

OTHER PUBLICATIONS

Kiran Kumar, Anthony Chou, Chuan Lin, Prasenjit Choudhury, and Jack C. Lee; "Optimization of sub 3 nm gate dielectrics grown by rapid thermal oxidation in a nitric oxide ambient," *American Institute of Physics, vol. 70*; Jan. 20, 1997; pp. 384–386.

* cited by examiner

*Primary Examiner*—Matthew Smith
*Assistant Examiner*—Renzo N. Rocchegiani
(74) *Attorney, Agent, or Firm*—Margaret Pepper; Cantor Colburn LLP

(57) ABSTRACT

A method for forming an ultra thin gate dielectric for an integrated circuit device is disclosed. In an exemplary embodiment of the invention, the method includes forming an initial nitride layer upon a substrate by rapidly heating the substrate in the presence of an ammonia ($NH_3$) gas, and then re-oxidizing the initial nitride layer by rapidly heating the initial nitride layer in the presence of a nitric oxide (NO) gas, thereby forming an oxynitride layer. The oxynitride layer has a nitrogen concentration therein of about $1.0 \times 10^{15}$ atoms/$cm^2$ to about $6.0 \times 10^{15}$ atoms/$cm^2$, and has a thickness which may be controlled within a sub 10 Å range.

11 Claims, 7 Drawing Sheets

METHOD FOR FORMING HEAVY NITROGEN-DOPED ULTRA THIN OXYNITRIDE GATE DIELECTRICS

BACKGROUND

The present invention relates generally to semiconductor processing and, more particularly, to improved techniques for fabricating gate dielectrics.

As integrated circuits have become smaller and more densely packed, so have the dielectric layers of devices such as field effect transistors and capacitors. With the arrival of ULSI (Ultra Large Scale Integrated circuit) technology and gate dielectrics of less than 15 angstroms (Å) in thickness, the use of silicon dioxide ($SiO_2$) as a traditional gate dielectric material becomes problematic.

In larger devices (e.g., where the gate oxide thickness is 40 Å or more), leakage currents from a polysilicon gate electrode, through the gate oxide and into the device channel, are only on the order of about $1 \times 10^{-12}$ $A/cm^2$. However, as the thickness of an $SiO_2$ gate dielectric is decreased below 20 Å, the leakage currents approach values of about 1 $A/cm^2$. This magnitude of leakage current, caused by direct tunneling of electrons from the polysilicon gate electrode through the gate oxide, results in prohibitive power consumption of the transistor(s) in the off-state, as well as device reliability concerns over an extended period of time.

Another problem with ultrathin $SiO_2$ gate dielectrics relates to the doping of the polysilicon gate electrodes with a dopant material, such as boron. Such doping is typically used to combat channel depletion effects which cause voltage threshold ($V_t$) shifts and higher threshold voltages. With an ultrathin $SiO_2$ gate dielectric, however, the boron dopant atoms can easily penetrate the $SiO_2$ layer and thereby cause large $V_t$ shifts and reliability problems themselves.

Accordingly, the nitrogen doping of gate dielectrics has become a preferred technique of semiconductor chip manufacturers. For gate dielectrics having a thickness range of about 15 Å to 20 Å, silicon oxynitride ($SiO_xN_y$) layers have replaced $SiO_2$ layers as the choice of gate dielectric material. The beneficial effects of nitrogen incorporation into the dielectric are generally dependent upon the concentration of the doping and the distribution of the doping profile relative to both the $Si/SiO_2$ interface and the polysilicon gate/$SiO_2$ interface. If properly carried out, the nitrogen doping reduces leakage current and boron penetration, while minimizing or negating the impact on $V_t$ and channel electron mobility.

Present nitridation techniques, however, do have certain drawbacks associated therewith. For example, a rapid thermal annealing process (such as in the presence of $N_2O$ or NO gas) by itself may not result in a sufficiently high nitrogen content so as to faciliate the desired reduction in leakage current. In the case of a plasma process, such as remote plasma nitridation (RPN), the possibility exists that the ionized plasma species will cause damage to active devices formed on the semiconductor wafer.

BRIEF SUMMARY

The above discussed and other drawbacks and deficiencies of the prior art are overcome or alleviated by a method for forming an ultra thin gate dielectric for an integrated circuit device. In an exemplary embodiment of the invention, the method includes forming an initial nitride layer upon a substrate and then re-oxidizing the initial nitride layer, thereby forming an oxynitride layer. The oxynitride layer has a nitrogen concentration therein of at least $1.0 \times 10^{15}$ $atoms/cm^2$ and has a thickness which may be controlled within a sub 10 Å range.

In a preferred embodiment, forming the initial nitride layer includes rapidly heating the substrate in the presence of an ammonia ($NH_3$) gas at temperature of about 650° C. to about 1000° C., and at a pressure of about 1 Torr to about 760 Torr. Re-oxidizing the initial nitride layer includes rapidly heating the initial nitride layer in the presence of a nitric oxide (NO) gas at temperature of about 650° C. to about 1000° C., and at a pressure of about 1 Torr to about 760 Torr. The oxynitride layer preferably has a nitrogen atom concentration of about $1.0 \times 10^{15}$ $atoms/cm^2$ to about $6.0 \times 10^{15}$ $atoms/cm^2$.

BRIEF DESCRIPTION OF THE DRAWINGS

Referring to the exemplary drawings wherein like elements are numbered alike in the several Figures.

DETAILED DESCRIPTION

Figure 1A:
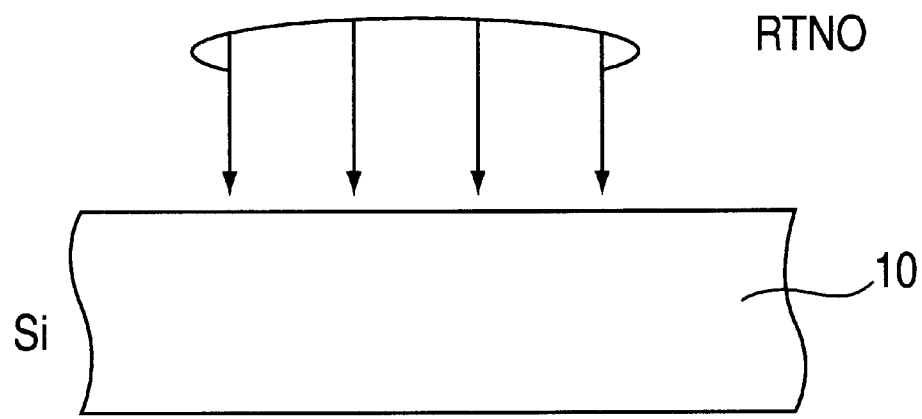
FIGS. 1(a)–(b) are schematic diagrams which illustrate the steps of a known process of forming a nitrided gate dielectric material.
Figure 1B:
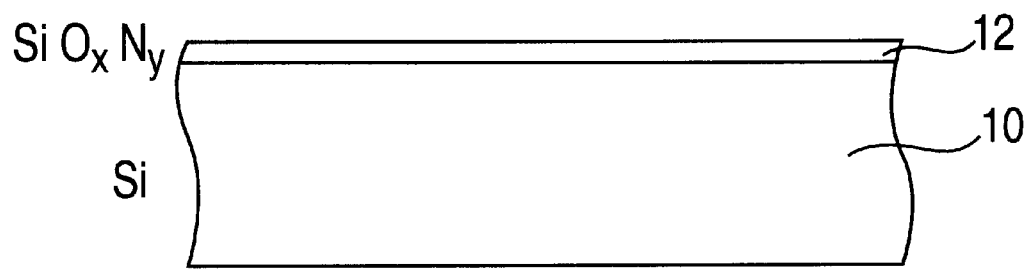

Referring initially to FIGS. 1(a) and 1(b), a known process of nitriding a gate oxide layer is illustrated. A silicon substrate 10 (e.g., either a bare silicon wafer or a silicon wafer having a thin $SiO_2$ layer thereupon) is subjected to a thermal anneal in the presence of a nitrogen containing gas, such as nitric oxide (NO). Alternatively, the gas may also be nitrous oxide ($N_2O$). Thereby, a layer of oxynitride ($SiO_xN_y$) film 12 is formed for use as a dielectric material, as shown in FIG. 1(b). One problem with layer 12, however, is the relatively low concentration of nitrogen atoms diffused therein. A lower nitrogen content dielectric is not as effective in reducing leakage current from the gate conductor. In addition, an $RTN_2O$ process by itself does not easily lend itself to producing reliable gate dielectric thicknesses below 10 Å.

Figure 2A:
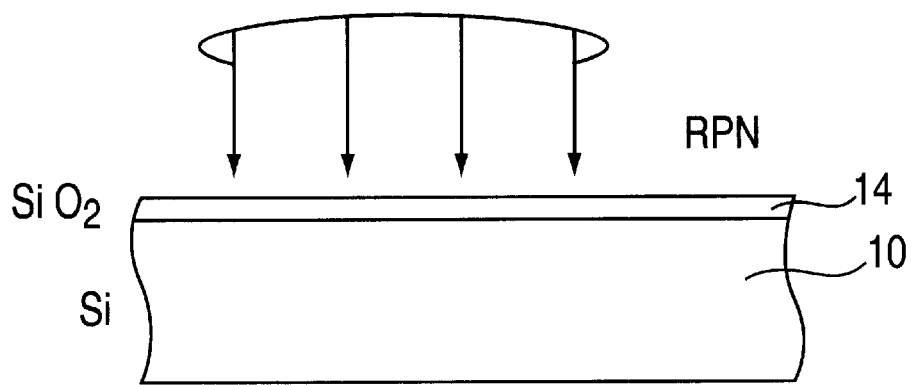
FIGS. 2(a)–(b) are schematic diagrams which illustrate the steps of another known process of forming a nitrided gate dielectric material.
Figure 2B:
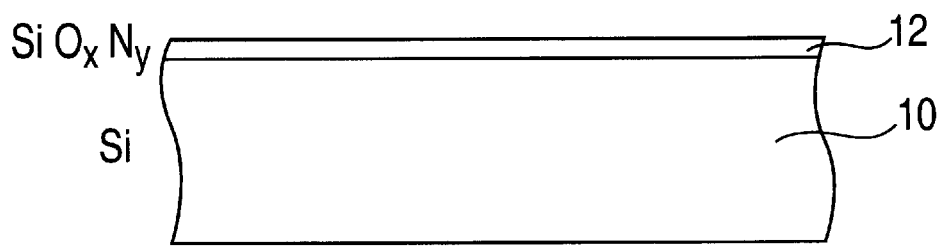
Figure 3:
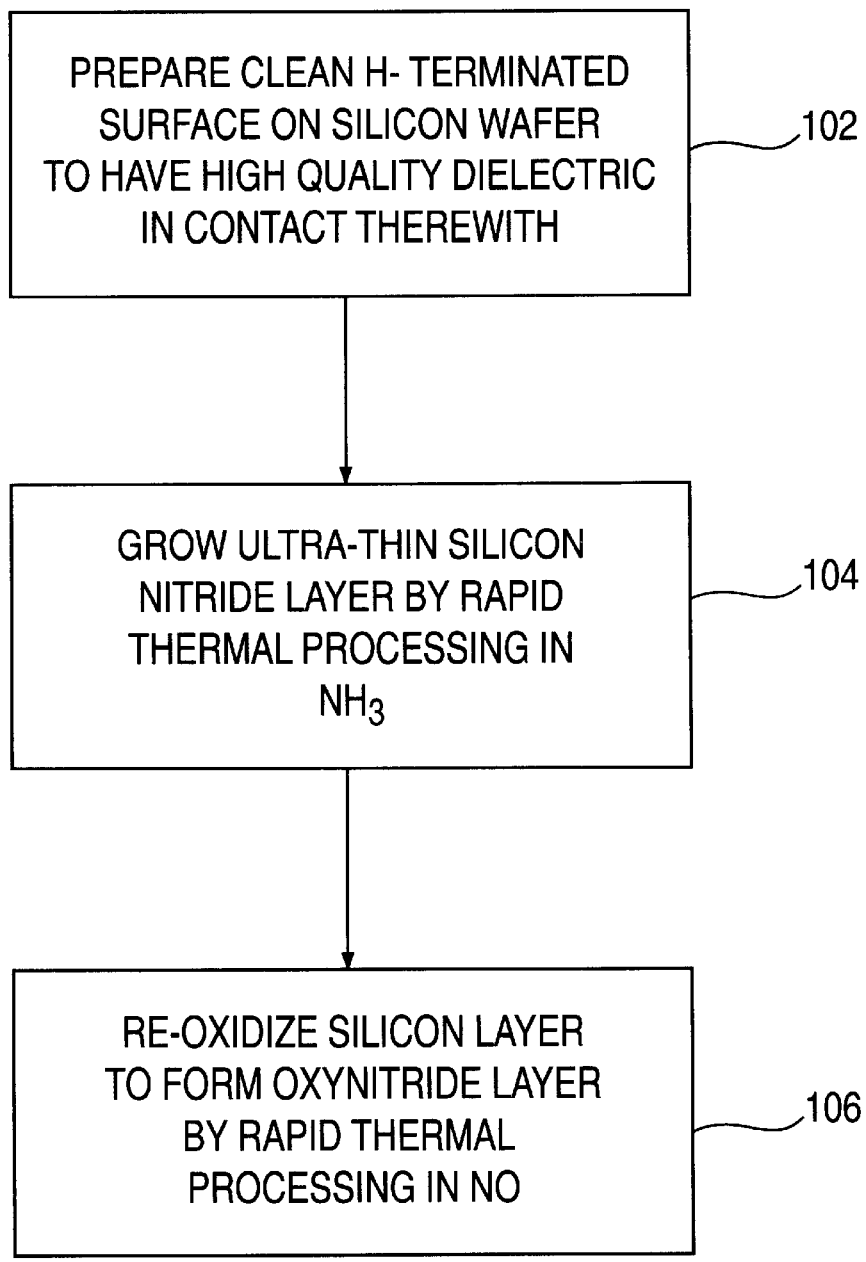
FIG. 3 is a process flow diagram which illustrates a method for forming a gate dielectric for an integrated circuit device, in accordance with an embodiment of the invention.
Figure 4A:
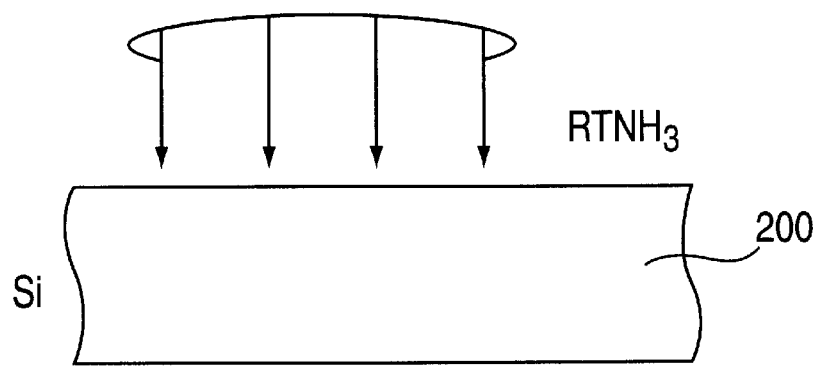
FIGS. 4(a)–(c) are schematic diagrams which illustrate the steps shown in FIG. 3.
Figure 4B:
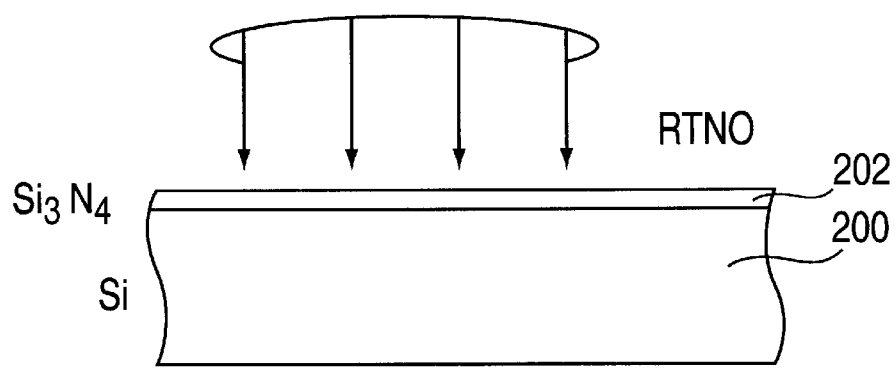
Figure 4C:
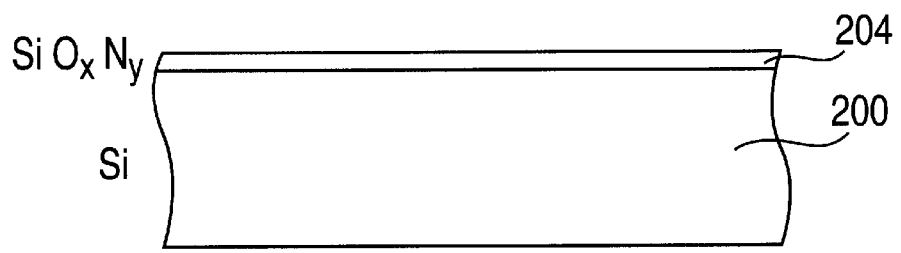

In FIGS. 2(a) and (b), there is shown another existing process of forming a nitrided gate dielectric. The silicon substrate 10 has an initial oxide layer ($SiO_2$) 14 formed thereupon. The wafer is then subjected to a plasma process, such as a remote plasma nitridation (RPN). As a result of the RPN process, the oxide layer 14 is converted to a silicon oxynitride layer 12 having the general chemical composition $SiO_xN_y$, as shown in FIG. 2(b). While an RPN process generally provides an increased nitrogen concentration in the oxynitride dielectric layer, the formation of a consistent, ultra-thin layer (5–10 Å) is still problematic. Moreover, the ionized plasma species generated during the process can cause damage to active devices formed on the semiconductor wafer, as stated earlier.

Therefore, in accordance with an embodiment of the invention, a preferred process flow for a method 100 of forming a gate dielectric for an integrated circuit device is shown in FIGS. 3 and 4(a)–(c). In step 102, a silicon substrate 200 is prepared with clean silicon surface for formation of the dielectric thereupon. The silicon surface is preferably hydrogen-terminated and initially cleaned of any oxide material thereupon. This may entail a preliminary cleaning step, such as by an ozone plasma clean and a dilute hydroflouric acid (DHF) etch. In step 104, an ultra-thin initial silicon nitride layer 202 is formed by rapid thermal processing in $NH_3$, thereby introducing a desired concentration of nitrogen atoms into the substrate 200 surface. In step 106, the silicon nitride layer 202 is re-oxidized by rapid thermal processing in nitric oxide (NO). While NO is a preferred gas for the thermal re-oxidation process, $O_2$ may also be used. An oxynitride dielectric layer 204 is thereby formed which has a desired nitrogen content thickness. Depending on the specific time, temperature and process conditions of the above steps, the oxynitride layer 204 may be scaled down below 10 Å in thickness.

More specifically, the initial silicon nitride layer (having the general chemical composition $Si_3N_4$) is formed on the silicon surface by heating in the presence of an ammonia ($NH_3$) gas at a temperature range of about 650° C. to about 1000° C. at a pressure range of about 1–760 Torr. For example, an initial rapid thermal ($RTNH_3$) process at a temperature of 900° C. and a pressure of 550 Torr for a duration of about 15 seconds is found to grow a silicon nitride layer of about 8 Å. In a preferred embodiment, the $RTNH_3$ process is carried out in a single wafer, rapid thermal process chamber, especially when forming ultra thin films (<20 Å). However, the semiconductor wafer may also be annealed in a batch processing tool such as a furnace.

Figure 5:
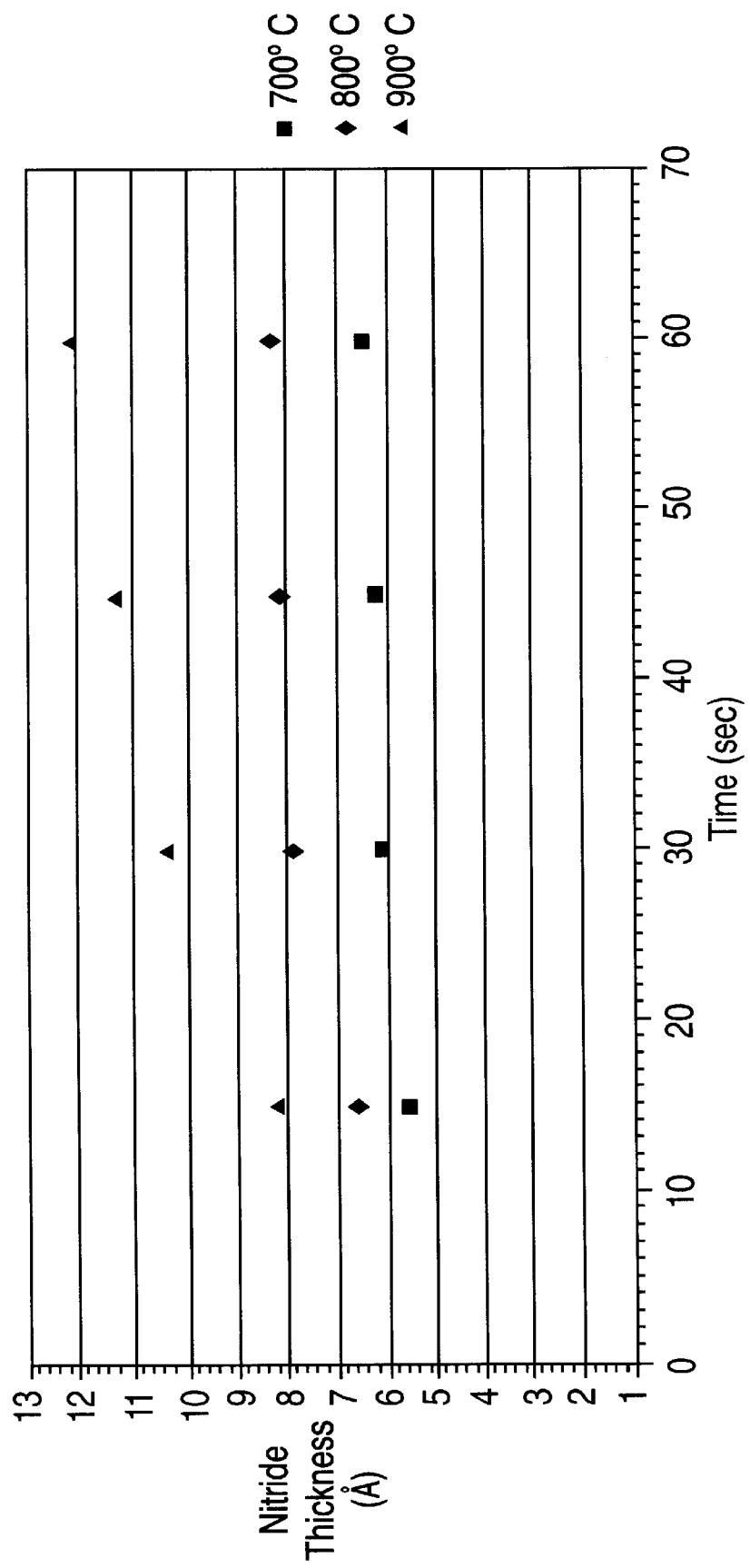
FIG. 5 is a graph which illustrates the resulting thicknesses of nitride layers formed by the $RTNH_3$ process.
Figure 6:
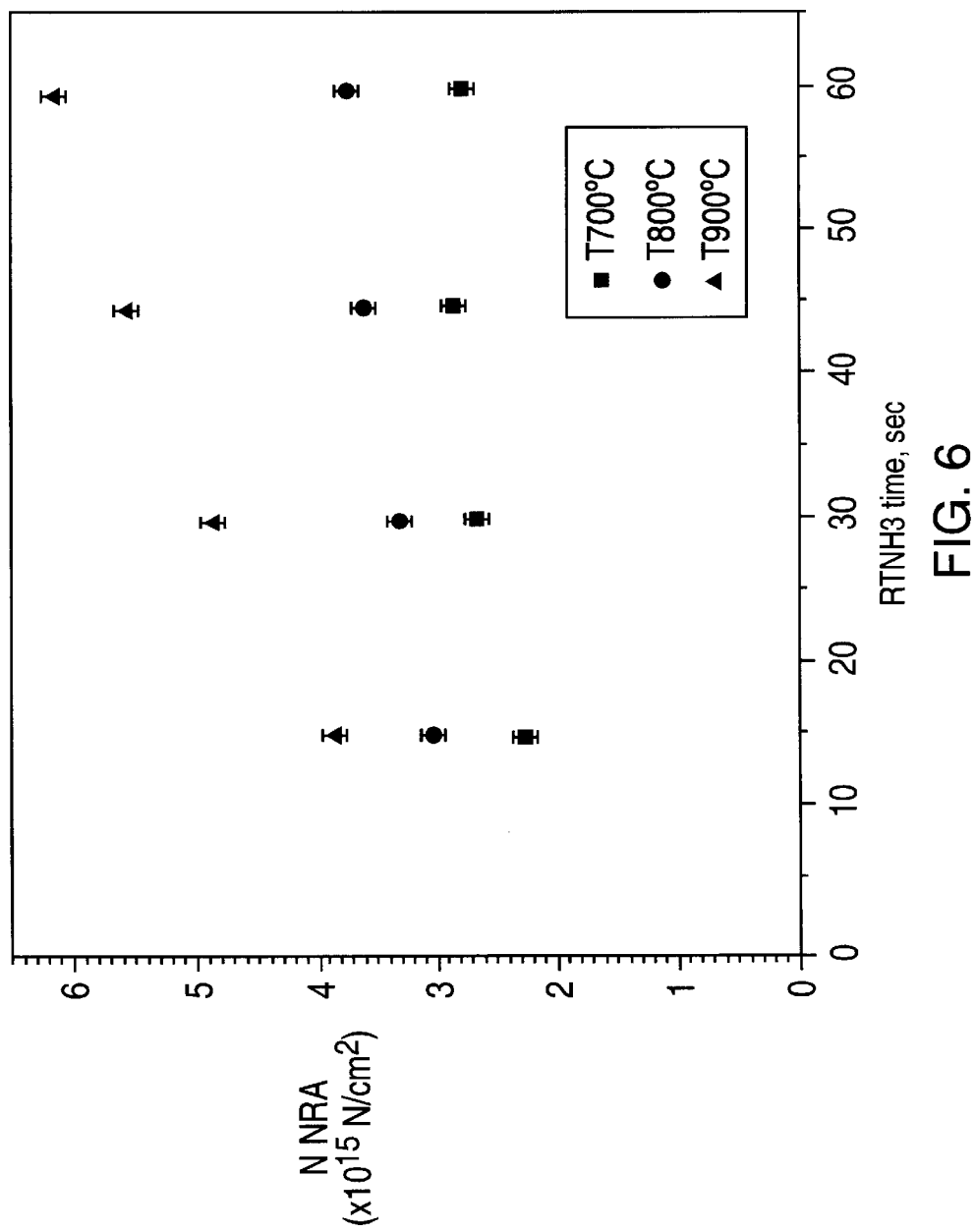
FIG. 6 is a graph which illustrates the initial nitrogen concentration introduced into the silicon nitride layer following the $RTNH_3$ process.

FIG. 5 is a graph which illustrates the resulting thicknesses of nitride layers formed by the $RTNH_3$ process at varying temperatures and times, at a pressure of 550 Torr. As can be seen, the nitride thickness ranges are about 5.5 Å at 700° C. to about 8.2 Å at 900° C. for a 15 second duration, and about 6.5 Å at 700° C. to about 12 Å at 900° C. for a 60 second duration. FIG. 6 illustrates the initial nitrogen concentration introduced into the silicon nitride layer following the $RTNH_3$ process. As suggested by the graph, the concentration of nitrogen incorporation may be tuned from about $1 \times 10^{16}$ N atoms/cm$^2$ to about $6 \times 10^{16}$ N atoms/cm$^2$, depending on the temperature, time and pressure conditions.

Next, the initial silicon nitride layer is subjected to a re-oxidation process by rapid thermal processing in nitric oxide (NO) gas to produce an oxynitride dielectric layer. This RTNO process may be carried out at a temperature range of about 650° C. to about 1000° C. at a pressure range of about 1–760 Torr. In the above example, the RTNO process implemented at 950° C., at a pressure of 740 Torr, for a duration of about 30 seconds resulted in an oxynitride layer of about 14.5 Å. The hydrogen incorporated into the silicon nitride layer during the ammonia nitridation is reduced by the oxygen present in the RTNO step and diffuses out at the high oxidation temperature.

Figure 7:
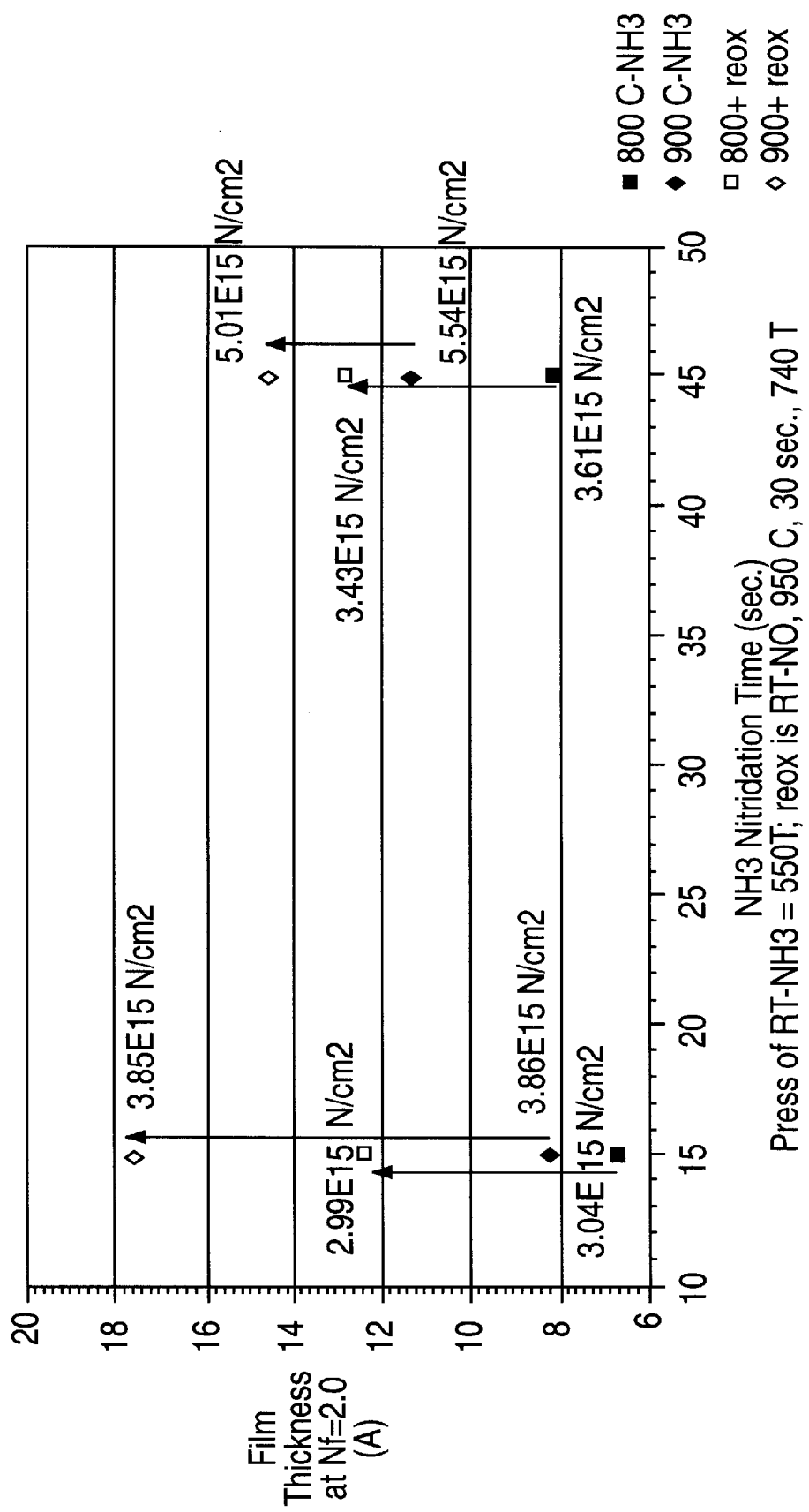
FIG. 7 is a graph which illustrates the resulting oxynitride film thickness and nitrogen concentration therein after re-oxidation of the initial silicon nitride layer.

Referring now to FIG. 7, there is shown a graph which illustrates the resulting oxynitride film thickness and nitrogen concentration therein after the re-oxidation of the initial silicon nitride layer. For example, the darkened square on the left portion of the graph represents the film thickness of the initial silicon nitride layer formed by $RTNH_3$ at 800° C. for 15 seconds. The initial thickness, about 6.5 Å, is increased to about 12.5 Å after RTNO re-oxidation (as indicated by the hollow square on the left portion of the graph). Moreover, the RTNO process does not substantially reduce the nitrogen concentration in the resulting oxynitride layer, as also shown in FIG. 5. Again, the initial silicon nitride layer formed by $RTNH_3$ at 800° C. for 15 seconds had a nitrogen concentration of about $3.04 \times 10^{15}$ atoms/cm$^2$, which was only reduced to about $2.99 \times 10^{15}$ atoms/cm$^2$ after re-oxidation.

For longer process times (e.g., 45 seconds), as seen on the right portion of the graph in FIG. 5, the nitrogen concentration decrease is somewhat greater after re-oxidation, but not significantly so. For example, an initial silicon nitride layer formed by $RTNH_3$ at 900° C. had a thickness of about 11.5 Å and a nitrogen concentration of about $5.54 \times 10^{15}$ atoms/cm$^2$ before re-oxidation (as indicated by the darkened diamond). Afterward, the resulting oxynitride layer had a thickness of about 14.5 Å and a nitrogen concentration of about $5.01 \times 10^{15}$ atoms/cm$^2$.

As a result of the above described processes, a reliable, ultra-thin gate dielectric with good film uniformity may be achieved. Furthermore, the process may be carried out in-situ, without plasma damage and/or metallic contamination. Other improved device characteristics are also realized. In a CMOS device employing both p-type and n-type transistors, the change in threshold voltage (as compared to a conventional 13 Å RTNO process only) is about 80 mV lower for an NFET device and about 200 mV higher for a PFET device. In addition, as compared to RTNO, the NFET device shows about a 0.7 A gate tunneling reduction with the $RTNH_3$+RTNO process.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method for forming a gate dielectric for an integrated circuit device, the method comprising:
    forming an initial nitride layer upon a substrate by rapidly heating said substrate in the presence of an ammonia ($NH_3$) gas; and
    re-oxidizing said initial nitride layer, thereby forming an oxynitride layer;
    wherein said oxynitride layer has a nitrogen concentration therein of at least $1.0 \times 10^{15}$ atoms/cm$^2$, and a thickness of about 5 Å to about 20 Å.

2. The method of claim 1, wherein:
    said forming an initial nitride layer is carried out at temperature of about 650° C. to about 1000° C., and at a pressure of about 1 Torr to about 760 Torr.

3. The method of claim 1, wherein said re-oxidizing said initial nitride layer further comprises:
    rapidly heating said initial nitride layer in the presence of a nitric oxide (NO) gas.

4. The method of claim 3, wherein:

said re-oxidizing said initial nitride layer is carried out at temperature of about 650° C. to about 1000° C., and at a pressure of about 1 Torr to about 760 Torr.

5. The method of claim 1, wherein said re-oxidizing said initial nitride layer further comprises:

rapidly heating said initial nitride layer in the presence of oxygen ($O_2$) gas.

6. The method of claim 1, wherein said oxynitride layer has a nitrogen atom concentration of about $1.0 \times 10^{15}$ atoms/cm$^2$ to about $6.0 \times 10^{15}$ atoms/cm$^2$.

7. A method for forming a nitrogen-doped, ultra thin gate dielectric, the method comprising:

preparing a hydrogen-terminated, oxide-free silicon substrate surface for formation of the dielectric thereupon;

forming an initial nitride layer upon said substrate surface by rapidly heating said substrate surface in the presence of an ammonia ($NH_3$) gas;

re-oxidizing said initial nitride layer by rapidly heating said initial nitride layer in the presence of a nitric oxide (NO) gas, thereby forming an oxynitride layer;

wherein said wherein said oxynitride layer has a nitrogen concentration therein of at least $1.0 \times 10^{15}$ atoms/cm$^2$.

8. The method of claim 7, wherein said oxynitride layer has a thickness of about 5 Å to about 20 Å.

9. The method of claim 7, wherein:

said forming an initial nitride layer is carried out at temperature of about 650° C. to about 1000° C., and at a pressure of about 1 Torr to about 760 Torr.

10. The method of claim 7, wherein:

said re-oxidizing an initial nitride layer is carried out at temperature of about 650° C. to about 1000° C., and at a pressure of about 1 Torr to about 760 Torr.

11. The method of claim 7, wherein said oxynitride layer has a nitrogen atom concentration of about $1.0 \times 10^{15}$ atoms/cm$^2$ to about $6.0 \times 10^{15}$ atoms/cm$^2$.

* * * * *